United States Patent [19]
Goldberg et al.

[11] 3,930,306
[45] Jan. 6, 1976

[54] PROCESS FOR ATTACHING A LEAD MEMBER TO A SEMICONDUCTOR DEVICE

[75] Inventors: Monroe B. Goldberg, Huntington Station; William B. Voorhis, Levittown, both of N.Y.

[73] Assignee: General Instrument Corporation, Clifton, N.J.

[22] Filed: Apr. 24, 1974

[21] Appl. No.: 463,678

[52] U.S. Cl. .................... 29/588; 29/589; 228/219; 357/67
[51] Int. Cl.² .......................................... B01J 17/00
[58] Field of Search ............. 29/588, 589, 504, 590, 29/591; 228/219

[56] References Cited
UNITED STATES PATENTS 3,378,914  4/1968  Miller ................................ 228/219
3,844,029  10/1974  Dibugnara ........................... 29/588

OTHER PUBLICATIONS

Brazing Manual, published by American Welding Society, Inc., Copyright 1963, pp. 39 and 40.

*Primary Examiner*—W. Tupman

[57] ABSTRACT

A thermally and electrically conductive metal lead member is joined to the refractory metal contact member of a semiconductor device using a brazing alloy comprising on a weight basis about 80–89 percent copper, about 5–15 percent silver, and about 4–6 percent phosphorus. The contact member/semiconductor joint may be formed in an inert atmosphere at the same time and at the same temperature as the contact member/lead member joint.

27 Claims, 3 Drawing Figures

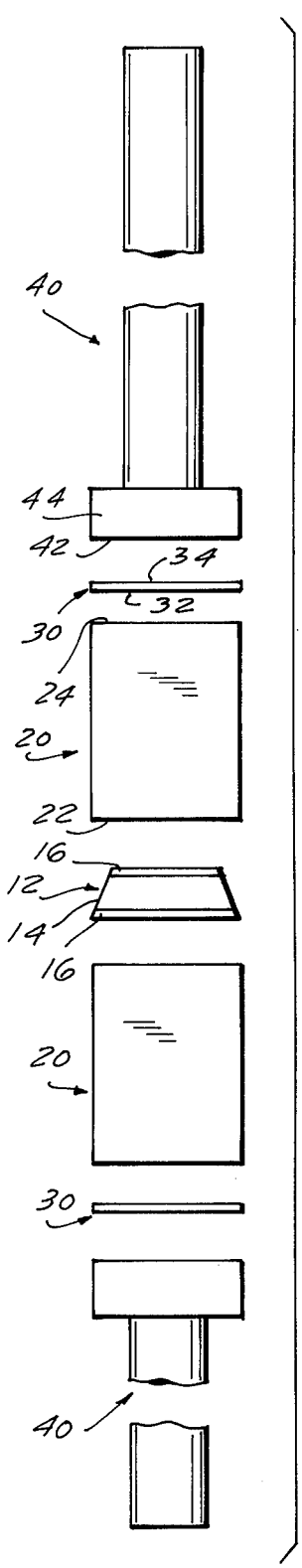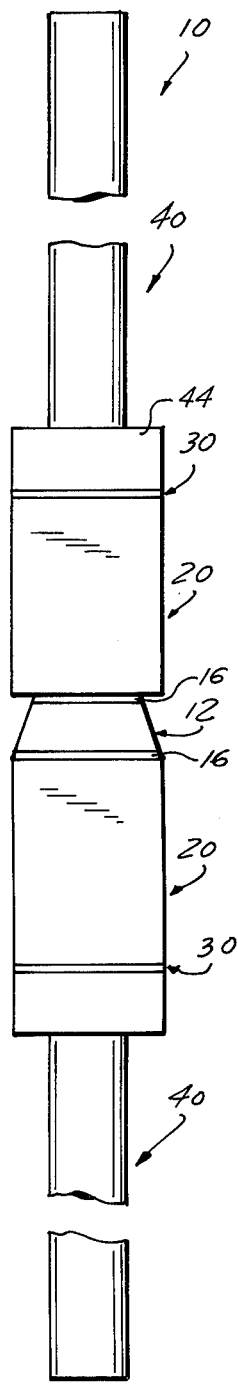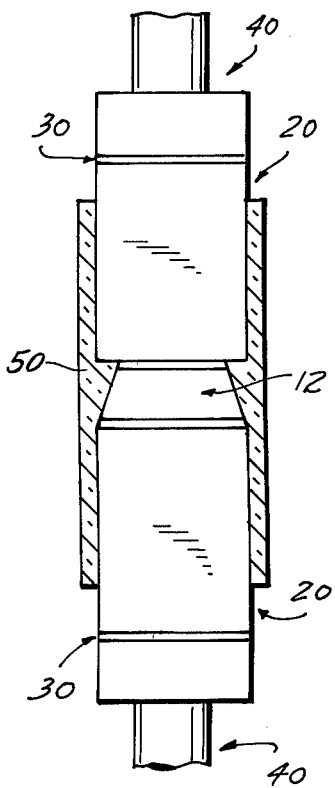

3,930,306

PROCESS FOR ATTACHING A LEAD MEMBER TO A SEMICONDUCTOR DEVICE

BACKGROUND OF THE INVENTION

The present invention relates to a process for attaching a thermally and electrically conductive lead to a refractory metal contact of a semiconductor device by a high temperature brazing process.

Passivated semiconductor devices generally include a semiconductor body composed substantially of silicon, a layer of passivating material such as glass or plastic disposed about the semiconductor body, and at least one metallic contact extending outwardly from the semiconductor body through the passivating layer as an external contact for connection with associated circuitry. More specifically, such devices require that the metallic contacts be refractory in nature in order that the coefficients of thermal expansion of the semiconductor body, the passivating layer and the metallic contact be reasonably matched to avoid breakage during thermal cycling. Molybdenum, tungsten, tantalum and various special alloys are typical of the refractory metals used as such refractory metal contacts; however, since such materials are both expensive and relatively poor conductors of both heat and electric current, the refractory metal contacts are generally joined to good conventional conductors (such as copper, silver or various special alloys) just beyond the passivating layer, the connection between the refractory contact and the other circuitry elements being made by the conventional conductor. In the case of axial-lead construction semiconductor rectifiers, the connection of the conventional axial lead to the refractory metal contact is accomplished by one of the following two procedures.

In the first procedure, the refractory material is initially plated with a solderable metal such as silver before application of the passivating layer. After the passivating operation, the axial leads are attached to the refractory metal contacts using "soft solder" preforms with melting points typically less than 300°C. Devices containing such connections have the disadvantages commonly associated with soft solder contacts. If extreme temperature control is not exercised in soldering the axial lead to other circuit components, the axial lead may detach from the refractory metal contact as the soft solder heats up. In any case, it has been found that such soft solder joints are subject to thermal fatigue and a resultant short operating life.

In the other procedure, the refractory metal contact is joined to the axial lead by a special welding process known as butt welding. The joint and the axial lead must thereafter be exposed to all the chemical and heat-treating processes subsequently required to (1) join the semiconductor body to the refractory metal contact, (2) etch the subassembly, and (3) apply and fuse the passivating glass layer. The devices fashioned according to this procedure are not reliable in the first place because a true weld is not possible between the refractory metal of the contact and the conventional conductive metal of the axial lead. Furthermore, the processing operations required to complete the semiconductor device subsequent to formation of the refractory contact/axial lead joint frequently result in a weak and porous joint which will develop high electrical and thermal resistance in time or eventually even fail mechanically and fall off. Experience has shown that butt welded joints have extremely high failure rates when exposed to conditions of high temperature and high humidity, the failure rate rising as high as 50 percent at 85°C and 85 percent relative humidity.

Accordingly, it is an object of the present invention to provide a process for attaching a thermally and electrically conductive lead to a refractory metal contact of a semiconductor device using a high temperature brazing process.

It is another object to provide such a process which avoids the aforementioned disadvantages of soft solder and "butt welded" joints.

It is also an object to provide such a process wherein the resultant joint is of higher physical strength and lower porosity than a butt-welded joint, withstands a higher temperature than a soft solder joint, and withstands conditions of high temperature and high humidity better than a butt-welded joint.

It is a further object to provide such a process which enables a conventional lead to be joined to a refractory contact at the same time and at the same temperature conditions as the refractory contact is joined to the semiconductor body.

Yet another object is to provide such a process which utilizes a special preform, is simple and economical to perform, is less expensive than a butt welding, and provides joints superior to those produced by soft solder or butt welding processes.

Yet a further object is to provide such a process whereby a joint between a semiconductor body and a refractory contact member is formed at the same time and at the same temperatures as the joint between the refractory contact member and a lead member.

A final object is to provide a semiconductor device having a lead member joined thereto by the aforesaid process.

SUMMARY OF THE INVENTION

It has now been found that the above and related objects of the present invention are obtained in a process for attaching a lead member to a semiconductor device by initially providing a lead member formed substantially of a thermally and electrically conductive metal and terminating at one end in a joining surface, and a semiconductor device comprising a semiconductor body and a contact member formed of a refractory metal extending outwardly from the body and terminating in a joining surface spaced from the body. The joining surfaces of the members are placed in contact with a brazing alloy comprising on a weight basis about 80–89 percent copper, about 5–15 percent silver, and about 4–6 percent phosphorus. The brazing alloy is then heated (preferably in an inert atmosphere) at least to its wetting point for a period of time sufficient to melt the brazing alloy. Thereafter the molten brazing alloy is allowed to cool and solidify in contact with the joining surfaces of the members, thereby to join the contact member and the lead member into a unitary structure. As a final optional step, a passivating layer of a passivating material may be applied and fused about the body and about the contact member between the joining surface thereof and the body.

The refractory metal is selected from the group consisting of tungsten, molybdenum, tantalum, and alloys thereof, and is preferably molybdenum. The conductive metal is selected from the group consisting of silver and copper and alloys thereof, and is preferably copper. The passivating material is selected from the group consisting of glass and plastic, and is preferably glass. The semiconductor body is formed substantially of silicon. The brazing alloy is preferably, on a weight basis, about 80 percent copper, about 15 percent silver and about 5 percent phosphorus. Preferably, the brazing alloy is provided as a preform with joining surfaces of substantially similar configuration and size abutting the joining surfaces of the members.

One aspect of the present invention provides a process for attaching a lead member to a semiconductor body utilizing a single heating step. The process utilizes a semiconductor body having a joining surface; a contact member formed substantially of a refractory metal and having a joining surface at each end thereof; a lead member formed substantially of a thermally and electrically conductive metal and having at one end a joining surface; and a brazing preform formed of a brazing alloy comprising on a weight basis about 80–89 percent copper, about 5–15 percent silver, and about 4–6 percent phosphorus, and having a joining surface at each end thereof. An assembly of these components is formed by simultaneously contacting the joining surface of the semiconductor body to one of the refractory metal joining surfaces of the contact member, the other of the refractory metal joining surfaces of the contact member to one of the brazing alloy joining surfaces of the preform; and the other of the brazing alloy joining surfaces of the preform to the conductive metal joining surface of the lead member. The assembly is then heated in an inert atmosphere at least to the the alloy wetting point to cause brazing of contacting joining surfaces. Thereafter the assembly is allowed to cool, thereby to join the semiconductor body, the contact member, the preform, and the lead member into a unitary structure. As an optional finishing step a passivating layer of a passivating material may be applied and fused about the semiconductor body and about the contact member between the refractory metal joining surfaces.

Generally the semiconductor body is formed substantially of silicon and has an electrically conductive layer of metal selected from the group consisting of aluminum and gold disposed thereon to define its joining surface.

In another aspect, the present invention provides a semiconductor device having a lead member. The device comprises a semiconductor body; a contact member formed of a refractory metal extending outwardly from the body and terminating in a joining surface spaced from the body; a lead member formed substantially of a thermally and electrically conductive metal and terminating at one end in a joining surface; and a brazing alloy disposed between and securing together the joining surfaces of the members thereby to join the members into a unitary structure. The device may additionally include a passivating layer of a passivating material disposed about the body and about the contact member between the joining surface thereof and the body.

BRIEF DESCRIPTION OF THE DRAWING

FIG. 1 is a fragmentary exploded plan view of a semiconductor subassembly including axial conductive lead members;

FIG. 2 is a fragmentary plan view of the subassembly of FIG. 1; and

FIG. 3 is a fragmentary plan view of the subassembly of FIG. 2 after brazing of the joints and application of a passivating layer thereto.

DESCRIPTION OF THE PREFERRED EMBODIMENTS

Referring now to the drawing and in particular to FIG. 2 thereof, therein illustrated is a semiconductor device subassembly generally designated by numeral 10, the individual components of the subassembly 10 being illustrated in exploded view in FIG. 1. The semiconductor generally designated by the numeral 12 comprises a diffused silicon chip 14 and, at each end thereof, a layer of evaporated aluminum 16 forming a joining surface for the semiconductor 12. The semiconductor body 14 is formed substantially of silicon, although one or more portions thereof may have minute quantities of various conventional dopants such as phosphorus, boron and the like, as will be well recognized by those skilled in the semiconductor art. For clarity in illustrating the principles of the present invention the semiconductor 12 has been illustrated as a rectifier adapted for connection to only two lead members, although the principles of the present invention apply as well to any other semiconductors, such as the N-type, P-type, or combination type and those useful as junction, field effect, or other types of semiconductors. The principles of the present invention apply regardless of whether the semiconductor device comprises a single thin wafer-like diode (as shown) or a relatively long stack of several chips joined in series and brazed together with conventional materials (such as aluminum), with each of the various chips having a plurality of leads extending therefrom. The aluminum joining surfaces 16 may be applied to the silicon chip 14 by conventional techniques well known in the semiconductor art, the preferred technique being an evaporation deposition technique.

A refractory contact member 20, generally referred to as a "slug", includes joining surfaces 22 and 24 at opposite ends thereof. The contact member 20 is formed of a refractory material and is preferably composed substantially of molybdenum, tungsten, tantalum and alloys thereof. Whether the alloys be composed of two or more of the aforementioned refractory metals or of one or more of the refractory metals with other materials, the alloys must, of course, be selected according to their known coefficients of expansion to insure that the coefficients of expansion of the semiconductor body 12, the contact member 20 and any materials used to passivate the semiconductor body 12 are compatible.

A brazing alloy preform generally designated by the numeral 30 is of relatively planar configuration and has opposed joining surfaces 32 and 34 at opposite ends thereof. The brazing alloy comprises on a weight basis about 80–89 percent copper, about 5–15 percent silver, and about 4–6 percent phosphorus, and is preferably a commercially available 80/15/5 silver solder or high temperature brazing alloy marketed by Englehard Industries Division of Englehard Minerals and Chemicals Corp. (Murray Hill, N.J.) under the trademark "Silvaloy 15" and by Handy and Harmon, Inc. under the trademark "Silfos". The brazing alloy is characterized by a freezing point of about 640°C and a wetting point of about 705°C, and requires neither an oxidizing nor reducing environment during the brazing process.

A nail-headed axial lead member generally designated by the numeral 40 has a joining surface 42 on the exposed surface of the head 44 thereof, the tail or other end being available for connection to other circuitry members. The lead member 40 is formed of a thermally and electrically conductive metal such as copper, silver, or alloys thereof, the alloys of such metals by themselves or individually with other materials being selected for their ability to braze well with the brazing alloy of the preform 30. While it is preferred that the conductive metal of joining surface 42 be formed substantially of the aforementioned copper, silver or alloys thereof, a core or sheath is frequently used in connection with the contact member 40 to facilitate its functioning as a heat sink for the semiconductor body 12, to reduce the cost of the materials used in the lead member 40, and/or to provide electrical insulation for lead member 40.

The refractory contact member 20 may be joined to the semiconductor chip 12 by placing refractory joining surface 22 against aluminum joining surface 16 and conventionally brazing the aluminum joining surface 16 to both of the surfaces 12 and 22, to form a refractory metal/aluminum/silicon brazed joint. The aluminum and silicon form a "hard contact" eutectic having a melting point of about 575°C which joins extremely well with both the silicon chip 14 and the refractory metal joining surface 22. Due to the nature of the aluminum and silicon materials involved, it is essential that this joint be formed by brazing in an inert atmosphere (i.e., one that is neither an oxidizing nor a reducing atmosphere), and is typically performed in a controlled environment of one atmosphere, or slightly higher, of dry nitrogen, argon, or a similar inert gas.

The lead member 40 may be joined to the contact member 20 by placing the joining surface 42 of the lead member 40 and the joining surface 24 of the contact member 20 in contact with the joining surfaces 34 and 32, respectively, of the preform 30. To facilitate this operation the various joining surfaces 24, 32, 34, 42 are substantially of the same size and configuration. The preform 30 is then rapidly heated (for about 15 minutes) at least to its wetting point of about 705°C, held at that temperature for a period of time sufficient to melt the alloy (generally about 5 minutes) and thereafter the molten alloy of the preform 30 is allowed to cool and solidify in contact with the joining surfaces 24, 42 of the contact member 20 and lead member 40, thereby joining the members 20, 40 into a unitary structure. This brazing operation may be performed under atmospheric conditions —i.e., in a reducing, inert, or oxidizing environment; however, care must be taken to insure that the non-inert gases of the atmosphere do not come in contact with the aluminum joining surface 16 which is inevitably heated as part of the heating of brazing alloy preform 30.

While the two brazing operations —contact member 20 to lead member 40 and contact member 20 to semiconductor chip 12— may be performed separately as indicated above, a unique aspect of the present invention is that both brazing operations may be performed at the same time and at the same temperature, thus reducing production time, the tie-up of expensive heating equipment, and the possible contamination of the components through excessive handling. In the single step brazing process, the components are assembled in a subassembly 10, as indicated in FIG. 2, with the aluminum joining surface 16 of the semiconductor 12 contacting the refractory joining surface 22 of the contact member 20, the other joining surface 24 of the contact member 20 contacting the joining surface 32 of the preform 30, and the other joining surface 34 of the preform 30 contacting the joining surface 42 of the lead member 40. A brazing fixture or jig of graphite, stainless steel or other conventional material is suitable employed to hold the components of the subassembly 10 in proper orientation during passage through the furnace. The entire subassembly 10 is then placed on a conveyor belt which carries it through a tunnel furnace provided with an inert atmosphere such as dry nitrogen at one atmosphere. The maximum temperature within the tunnel furnace is sufficient both to melt the brazing preform 30 and to form the molten aluminum/silicon eutectic, and is preferably about 715°–720°C. Generally a dwell time of about 50–60 minutes within the tunnel furnace is sufficient to cause brazing of the lead member 40 to the contact member 20 as well as brazing of the contact member 20 to the semiconductor chip 12. Preferably, the entire subassembly 10 is heated over a 15 minute entry period to at least 705°C to cause formation of the molten aluminum/silicon eutectic and melting of the brazing alloy, held there for about 5 minutes, and then slowly cooled over a 30–40 minute period to below the 575°C melting point of the eutectic.

The use of either the one or two step process results in the subassembly 10 being integrated into a unitary structure having brazed joints which withstand higher temperature than soft solder joints, are stronger and less porous than butt welded joints, and withstand thermal cycling to high temperatures and high humidity conditions (such as 85°C and 85 percent relative humidity) without failure or the development of high electrical and thermal resistances. The solidity and strength of the brazed joints thus formed permit the subassembly 10 to be further processed wet without resultant damage to the semiconductor device.

Thus, after the one or two step brazing operation, the exposed surface of the semiconductor body 14 is preferably etched to remove contaminants (e.g., with a solution of nitric and hydrofluoric acids), and a layer of passivating material 50 applied thereto to prevent recontamination. The passivating material 50 is applied over the exposed surface of semiconductor body 14 and a portion of the contact member 20 between the joining surfaces 22, 24 thereof to completely encapsulate the semiconductor device 12 and protect it from exposure to contamination. Referring now to FIG. 3, the passivating material 50 is typically plastic or glass which has been finely ground into a slurry, applied by a conventional technique onto the exposed surface of the semiconductor body 14, and finally heated in situ to a temperature sufficient to fuse the passivating material 50. For example, a second tunnel furnace located downstream on the conveyor belt from the aforementioned furnace used for the single step brazing operation, may be maintained at a temperature of about 685°C to about 700°C to fuse a glass passivating material applied to the semiconductor 12. Both the preform 30 and the eutectic at the joints may become fluid again at the temperatures in the second tunnel furnace; however, the surface tensions of the brazed joints formed in the brazing processes are sufficient to maintain the molten joints until cooling reoccurs as the subassembly 10 leaves the second tunnel furance.

Because the passivating material 50, the semiconductor body 14 and the refractory member 30 all exhibit compatible coefficients of expansion, the passivated semiconductor devices of the present invention exhibit a desirably long life under repeated thermal cycling.

In the brazing alloy composition, the copper (melting point 1083°C) constitutes the main brazing component, with the silver (melting point 960.5°C) and the phosphorus (melting point 44°C) lowering the wetting point of the composition to a temperature usable in connection with semiconductor devices, and the phosphorus also providing the necessary fluxing action. The ability of the composition to perform brazing in an inert atmosphere is an important factor in enabling the single step process, as is the absence of any high vapor pressure metals therein (such as zinc or cadmium) which might adversely affect the semiconductor body 14. The use of the specific brazing alloy of the preform 30 permits a brazed joint to be formed between the lead member 40 and the contact member 20 under conditions which are also effective to cause a brazed joint of the contact member 20 to the semiconductor body 14, thus permitting a unique one step brazing operation.

Now that the preferred embodiments of the present invention have been shown and described, various modifications and improvements thereon will become readily apparent to those skilled in the art. Accordingly, the spirit and scope of the present invention is to be understood as being limited not by the foregoing disclosure, but only by the appended claims.

We claim:
1. A process for attaching a lead member to a semiconductor device comprising the steps of
   A. providing a lead member formed substantially of a thermally and electrically conductive metal and terminating at one end in a joining surface; and a semiconductor device comprising a semiconductor body and a contact member formed of a refractory metal extending outwardly from said body and terminating in a joining surface of said refractory metal spaced from said body;
   B. placing said joining surfaces of said members in contact with a brazing alloy comprising on a weight basis about 80–89 percent copper, about 5–15 percent silver, and about 4–6 percent phosphorus;
   C. heating the brazing alloy at least to its wetting point for a period of time sufficient to melt the brazing alloy; and
   D. allowing the molten brazing alloy to cool and solidify in contact with said joining surfaces of said members, thereby to join said contact member and said lead member into a unitary structure.
2. The process of claim 1 including the additional step of subsequently applying and fusing a passivating layer of a passivating material about said body and about said contact member between said joining surface thereof and said body.
3. The process of claim 1 wherein the refractory metal is selected from the group consisting of tungsten, molybdenum, tantalum, and alloys thereof.
4. The process of claim 3 wherein said refractory metal is molybdenum.
5. The process of claim 1 wherein the conductive metal is selected from the group consisting of silver and copper and alloys thereof.
6. The process of claim 5 wherein said conductive metal is copper.
7. The process of claim 2 wherein the passivating material is selected from the group consisting of glass and plastic.
8. The process of claim 7 wherein the passivating material is glass.
9. The process of claim 1 wherein said semiconductor body is formed substantially of silicon.
10. The process of claim 2 wherein said refractory metal is molybdenum, said conductive metal is copper, said passivating material is glass, and said semiconductor body is formed substantially of silicon.
11. The process of claim 1 wherein the heating of step (C) is performed in an inert atmosphere.
12. The process of claim 1 wherein said joining surfaces of said members are of substantially the same configuration and size, and wherein the brazing alloy is provided as a preform with joining surfaces of substantially similar configuration and size abutting said joining surfaces of said members.
13. The process according to claim 2 wherein said refractory metal is selected from the group consisting of tungsten, molybdenum, tantalum, and alloys thereof; said thermally and electrically conductive metal is selected from the group consisting of silver, copper and alloys thereof; said brazing alloy comprises on a weight basis about 80 percent copper, about 15 percent silver and about 5 percent phosphorus; and said passivating material is selected from the group consisting of glass and plastic.
14. A process for attaching a lead member to a semiconductor body comprises the steps of
   A. providing (i) a semiconductor body having a joining surface; (ii) a contact member formed substantially of a refractory metal and having a joining surface of said refractory metal at each end thereof; (iii) a lead member formed substantially of a thermally and electrically conductive metal and having at one end a joining surface; and (iv) a brazing preform formed substantially of a brazing alloy comprising on a weight basis about 80–89 percent copper, about 5–15 percent silver, and about 4–6 percent phosphorus, and having a joining surface at each end thereof.
   B. forming an assembly by simultaneously contacting (i) said joining surface of said semiconductor body to one of said refractory metal joining surfaces of said contact member; (ii) the other of said refractory metal joining surfaces of said contact member to one of said brazing alloy joining surfaces of said preform; and (iii) the other of said brazing alloy joining surfaces of said preform to said conductive metal joining surface of said lead member;
   C. heating said assembly in an inert atmosphere at least to the alloy wetting point to cause brazing of contacting joining surfaces; and
   D. allowing said assembly to cool, thereby to join said semiconductor body, said contact member, said preform, and said lead member into a unitary structure.
15. The process of claim 14 wherein said refractory metal is selected from the group consisting of molybdenum, tungsten, tantalum and alloys thereof.
16. The process of claim 15 wherein said refractory metal is molybdenum.
17. The process of claim 14 wherein said conductive metal is selected from the group consisting of copper and silver and alloys thereof.

18. The process of claim 17 wherein said conductive metal is copper.

19. The process of claim 14 wherein said semiconductor body is formed substantially of silicon and has an electrically conductive layer of metal selected from the group consisting of aluminum and gold disposed thereon to define said joining surface thereof.

20. The process of claim 14 wherein said refractory metal is molybdenum, said conductive metal is copper, and said semiconductor body is formed substantially of silicon with a layer of aluminum disposed thereon to define said joining surface thereof.

21. The process of claim 14 including the additional step of subsequently applying and fusing a passivating layer of a passivating material about said semiconductor body and about said contact member between said refractory metal joining surfaces.

22. The process of claim 21 wherein said passivating material is selected from the group consisting of glass and plastic.

23. The process of claim 22 wherein said passivating material is glass.

24. The process of claim 21 wherein said refractory material is molybdenum, said conductive metal is copper, said passivating material is glass, and said semiconductor body is formed substantially of silicon and has an electrically conductive layer of aluminum disposed thereon to define said joining surface thereof.

25. The process according to claim 14 wherein said semiconductor body is formed substantially of silicon and has an electrically conductive layer of a metal selected from the group consisting of aluminum and gold disposed thereon to define said joining surface thereof; said refractory metal is selected from the group consisting of molybdenum, tungsten, tantalum, and alloys thereof; said thermally and electrically conductive metal is selected from the group consisting of copper, silver and alloys thereof; and said brazing alloy comprises on a weight basis about 80 percent copper, about 15 percent silver, and about 5 percent phosphorus.

26. The process of claim 25 including the additional step of subsequently applying and fusing a passivating layer of a passivating material selected from the group consisting of glass and plastic about said semiconductor body and about said contact member between said refractory joining surfaces.

27. The process of claim 14 wherein said assembly is heated in an inert atmosphere at substantially atmospheric pressure.

* * * * *